Nov. 8, 1966 G. L. HOBROUGH 3,284,712

TUNNEL DIODE MODULATOR

Filed Sept. 13, 1963

INVENTOR.
GILBERT L. HOBROUGH
BY Stanley Bialek
Bialos & Schlemmer
ATTORNEYS

United States Patent Office 3,284,712

Patented Nov. 8, 1966

3,284,712

TUNNEL DIODE MODULATOR

Gilbert L. Hobrough, Los Altos, Calif., assignor to Itek Corporation, Lexington, Mass., a corporation of Massachusetts Filed Sept. 13, 1963, Ser. No. 311,607
12 Claims. (Cl. 325—105)

This invention relates to a modulator and to a method of modulation; and more particularly, it relates to a tunnel diode modulator useful wherever a suppressed-carrier type of operation is required and the carrier signal is to be controlled by means of a relatively slowly varying controlling signal.

A tunnel diode by virtue of its somewhat N-shaped voltage-current characteristic provides two areas of operation at which modulator action may be produced, and a portion of each such area extends into a region of negative resistance on such characteristic curve (the negative resistance region of operation being a unique feature of the tunnel diode). However, it is difficult to attain operation of the tunnel diode in this negative resistance region and it has a tendency to oscillate whenever operated therein. Such tendency to oscillate must be eliminated if the tunnel diode is to be used as a modulator; accordingly, an object of the present invention is to provide a tunnel diode modulator circuit wherein stable operation of the tunnel diode is attained after achieving operation thereof in the negative resistance region.

Another object of the invention is in the provision of a modulator circuit in which a tunnel diode is utilized in effecting modulation of a carrier signal, and an output current waveform produced therefrom without interaction between the input and output signals.

Still another object is that of providing a tunnel diode modulator circuit in which operation of the tunnel diode in the negative resistance region thereof is obtained by maintaining the direct current resistance in series with the diode at a lower value than the maximum value of the negative resistance exhibited thereby.

A further object of the invention is to provide a mounting arrangement for the tunnel diode which utilizes a section of a printed circuit board as an initial capacitance coupled to the diode in a low inductance configuration effective to stabilize operation of the diode in the negative resistance operational region against high frequency oscillations.

Yet a further object is that of providing a circuit network in which a pair of tunnel diode modulators having the aforementioned characteristics have their outputs connected to a common point of addition and feed a common amplifier operative to raise the output level of the modulators to a value suitable for driving subsequent circuitry.

Additional objects and advantages of the invention will become apparent as the specification develops.

An embodiment of the invention is illustrated in the accompanying drawings, in which—

Figure 1:
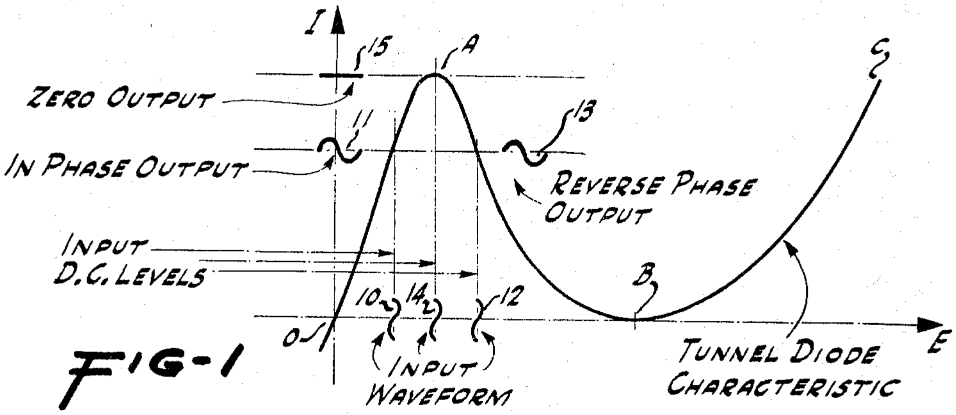
FIGURE 1 is a typical voltage-current characteristic curve of a tunnel diode.

FIGURE 1 illustrates a typical tunnel diode voltage-current characteristic curve, and in this figure the current and voltage axes are respectively identified as I and E, and intersect at an origin O. The curve has a generally N-shaped configuration and has a peak point A, a valley point B and a forward point generally located at C. Between points O and A is a positive resistance region (also along that portion of the curve extending from B through C); and between points A and B is a negative resistance region; and within this latter region, as the voltage E is increased the current I decreases.

In general, an alternating current input voltage waveform applied to the diode will produce a similar output waveform; and if the zero level of the input voltage waveform lies in a region of positive resistance, the output current waveform will be in phase with the input waveform. Conversely, if the zero level of the input voltage waveform lies in the region of negative resistance, the phase of the output current waveform will be reversed with respect to the input waveform. However, if the zero level of the input voltage waveform coincides with a point of zero slope (i.e., point A or B) on the characteristic curve, no output waveforms will be obtained.

In FIGURE 1 an input voltage waveform 10 is shown as being applied in the region O–A of positive resistance which produces an output current waveform 11 in phase therewith, an input voltage waveform 12 is shown as being applied in the negative resistance region A–B which produces an output current waveform 13 of reverse phase, and an input voltage waveform 14 as shown as being applied in coincidence with the point A of zero slope and produces a substantially zero output current waveform 15. Evidently then, by shifting the zero level of the input voltage waveform, the output current waveform can be varied through zero and reversed in phase with respect to the input waveform; and as the zero level of the input waveform approaches a point of zero slope on the characteristic curve, the output waveform is reduced in amplitude and finally becomes zero at such point of zero slope.

There are two points of zero slope on the characteristic curve—one being point A which corresponds to the peak current value, and the other being point B which corresponds to the valley current value. Modulator action can be achieved about either of these points A and B; but in practice, it appears preferable to utilize point A rather than point B for modulator action, because the slopes of the positive and negative portions of the curve are more symmetrical with respect to point A than they are with respect to point B, and because the characteristic curve about point A is very nearly parabolic whereas the curvature about point B is more circular. As a result of such parabolic curvature and the symmetry thereof, modulator action about point A is more nearly linear than about point B, and therefore the amplitude of the output current waveform for an input voltage waveform of constant amplitude is a nearly linear function of the displacements of the input level from point A. Since, as stated, the output current waveform is reduced in amplitude toward zero and finally becomes such as the zero level of the input waveform (i.e., the carrier signal) approaches and finally reaches one of the points of zero slope, the carrier signal or input waveform is evidently suppressed whenever the zero level thereof is adjacent any such point of zero slope and, accordingly, a suppressed-carrier type of operation is provided by modulator action about one or the other of such points.

Figure 2:
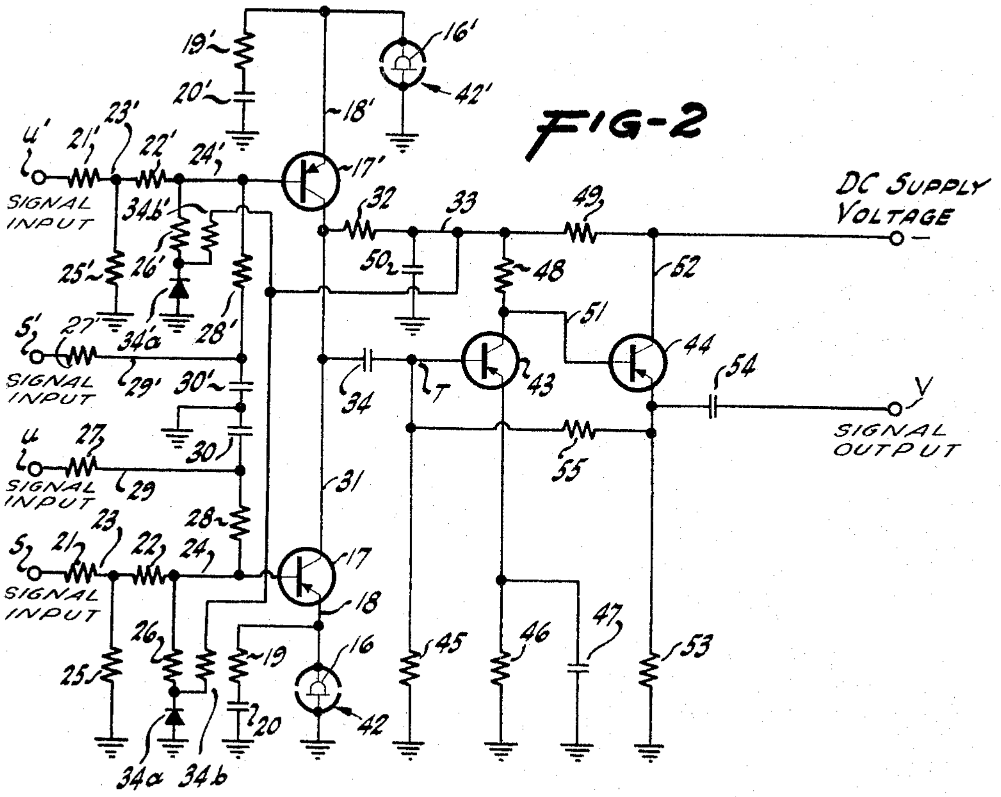
FIGURE 2 is a schematic circuit diagram ilustrating a pair of tunnel diode modulators feeding a common point of addition and an amplifier connected thereto.

The embodiment of the invention illustrated in FIGURE 2 comprises two identical modulator circuits additively connected to an amplifier circuit through a common output. Considering one such modulator in detail, the circuit thereof includes a tunnel diode 16, which performs the modulation functions of the circuit, and a transistor 17. The anode of the diode is grounded, and the cathode thereof is directly connected to the emitter of the transistor 17 through a conductor 18. In parallel with the diode 16 are a serially connected resistance 19 and capacitance 20, one side of the latter of which is grounded. An alternating voltage input waveform is applied to the base of the transistor 17 through an attenuation network comprising resistances 21 and 22, which are connected in series by a conductor 23 and are coupled to the base of the transistor through a conductor 24, and resistances 25 and 26—the first of which is connected between conductor 23 and ground and the latter between conductor 24 and ground. The attenuation network is operative to reduce the input voltage to an appropriately lower value as required by the tunnel diode modulator. The direct current input for the control voltage, which is the zero level of the alternating current input waveform, is applied to the base of the transistor 17 through resistances 27 and 28 which are connected in series by a conductor 29—one side of the resistance 28 being connected to and at the potential of the conductor 24. A capacitor 30 is connected between ground and the conductor 29, and defines with the resistance 27 a filter network effective to smooth the control voltage. The resistance 28 prevents the alternating current input signal from being by-passed by the capacitance 30.

The collector of the transistor 17 is connected by a conductor 31 to a load resistance 32 coupled through a conductor 33 to a direct current voltage supply. The output of the transistor 17 is coupled to the amplifier through a capacitance 34, one side of which is connected to the collector of the transistor. A diode 34*a* connected between ground and the resistance 26, and a resistance 34*b* connected at one end to the common point between the resistance 26 and diode 34*a* and at its other end to the conductor 33, define a compensation network effective across the tunnel diode 16 and transistor 17 to compensate for operational drift caused by changes in ambient temperature (the junctions of all of the elements 16, 17 and 34*a* being germanium).

In the circuit function, the tunnel diode 16 is coupled to the alternating current input terminal S and it is also coupled to the output terminal or point T by the transistor 17. Input signals applied to the base of the transistor are duplicated by emitter follower action and appear at the emitter thereof. Therefore, an input voltage waveform appearing at the terminal S is applied between ground and the base of the transistor 17, and appears as a voltage across the tunnel diode 16. Current flowing through the tunnel diode is identical with the load current flowing in the collector circuit of the transistor 17 except for any base current added thereto, which is ordinarily relatively small and with appropriate selection of the transistor 17 may be held normally to less than 1% of the collector current and therefore can be neglected.

Figure 3:
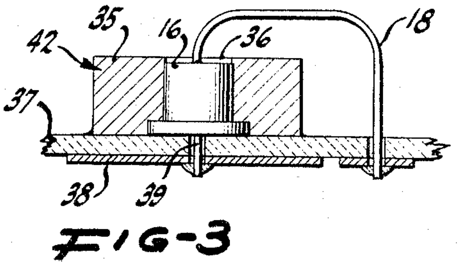
FIGURE 3 is a broken vertical sectional view illustrating the mounting of a tunnel diode in a section of a printed circuit board at least partially defining thereon the circuit shown in FIGURE 2.

In that the tunnel diode 16 is connected to the emitter of the transistor 17, the effective resistance in series with the tunnel diode is reduced to a very low value as, for example, approximately 20 ohms for the particular transistor and circuit values set forth hereinafter. This low resistance in series with the tunnel diode permits operation thereof in its negative resistance region. Stability in the operation of the diode in such negative resistance region is enhanced by minimizing any inductance in series with the diode; and to avoid a condition of operational instability arising from series inductance, a mounting arrangement of special character is used and the construction thereof is shown in FIGURE 3.

Illustrated in this figure is a metal housing or casing 35 in the form of a brass block drilled and counterbored or otherwise formed with a cavity 36 therein sized and shaped to snugly receive the diode 16 with a light press fit. The casing 35 is secured (as by adhesive) to the upper face of a printed circuit board or panel 37 formed of an insulating material as, for example, an epoxy glass. The lower face of the panel 37 is equipped with a ground conductor 38, and the anode lead of the diode is soldered thereto—the panel 37 and ground conductor 38 thereof being appropriately provided with an opening accommodating the passage of the lead therethrough (as shown generally at 39). The cathode lead 18 of the diode is internally connected to the casing thereof and extends through an opening therefor in the housing or casing 35. The lead 18 is electrically connected to the encapsulating casing 35 and to the appropriate conductor on the panel 37.

The mount for the diode 16 is generally designated in its entirety with the numeral 42, and is indicated diagrammatically in FIGURE 2. Such mount acts as a capacitance and by-passes the tunnel diode 16 without introducing appreciable inductance in series therewith. The capacitor mount 42 is operative to suppress oscillations within the tunnel diode structure from extremely high frequencies down to approximately two to three megacycles. Below the lower limit of such range, the tunnel diode will tend to oscillate owing to the inductance of the conductor connecting the same to the transistor 17 and also because of the inductance in the common ground conductors. Lower frequency oscillations of such type are suppressed by action of the resistance 19 and capacitance 20 in shunt connection with the diode. Thus, stability in the operation of the tunnel diode 16 in the negative resistance region thereof is obtained by the low inductance capacitance mount which suppresses high frequency oscillations, and by the shunt resistance-capacitance network which suppresses low frequency oscillations.

To illustrate the relative sizes of the elements comprising the capacitance mount 42, in a particular installation the casing 35 has a thickness of approximately 0.125 of an inch, the panel 37 has a thickness of about 0.062 of an inch, and the value of the capacitance provided by the mount is in the approximate range of 25 to 50 picofarads. It may be noted that the requirement for the low frequency oscillation-suppression network 19–20 may be decreased and finally overcome by making the capacitance of the mount 42 greater, which may be accomplished by increasing the lateral size thereof.

In operation of the modulator circuit, an input signal having an alternating voltage waveform (a square-shaped waveform, for example) is applied to the terminal S, and a D.C. control voltage is applied to the terminal U. In a typical circuit, the component values of which will be identified hereinafter, the input signal applied to the terminal S may have a value of approximately 10 volts from peak to peak, and the value thereof is reduced by the described attenuation network comprising the resistances 21–22 and 25–26 to approximately 10 millivolts. Such input signal is effectively applied across the tunnel diode 16, and the modulated duplicate of the input signal appears as a voltage at the terminal or point T which is due to the voltage drop across the load resistance 32 resulting from the current flow therethrough that, as heretofore stated, is essentially the same as the current flow through the tunnel diode 16.

The input signal applied to the base of the transistor 17 is controlled by means of the D.C. control signal applied to the terminal U; and since the control voltage produces current swings in the modulator output, the controlling voltage should be relatively slowly varying in that a slowly varying control signal is not communicated to the modulator output because of the low frequency cut-off provided by the coupling capacitance 34, which would not be the case in the event of a rapidly varying controlling signal being applied to the terminal U. The zero level of the input voltage waveform applied to the terminal S can be shifted by the controlling signal applied to the terminal U and, then, the output current waveform can be varied through zero and reversed in phase (as shown by the waveforms in FIG- URE 1) in accordance with variations in the controlling signal applied to the terminal U.

The modulator circuit described is identically duplicated in the network illustrated in FIGURE 2, and the various components of the second modulator are respectively identified by the primed form of the same numerals heretofore used. Although the two input signals to such circuit can be the same as those delivered to the terminals S and U, in the usual instance they will differ in some respect. Thus, in a typical instance, the D.C. control signals applied to the terminals U and U' are different but the carrier signals are the same. In any event, the two modulator output signals combine and together form the input signal to the amplifier, as will be described. Since the function of the second modulator circuit corresponds in all respects to the function of the modulator circuit described in detail, no additional description will be provided.

However, it may be noted that the load resistance 32 is common to both of the modulator circuits, and the modulator outputs are both coupled by the capacitor 34 (which is common to both) to the point T which, then, may be considered to be a point of addition for the modulator outputs; and such point of addition feeds the input of an amplifier comprising transistors 43 and 44. To a great extent, the amplifier circuit (including the transistors 43 and 44) is substantially conventional, and includes resistances 45 and 46 respectively connecting the base and emitter of the transistor 43 to ground—the resistance 46 being by-passed by a capacitance 47. The base of the transistor 43 is connected to the point T (that is, to one side of the coupling capacitance 34), and the collector of the transistor is connected through a resistance 48 to a conductor 33 which, in turn, is connected to the supply voltage through a resistance 49. The conductor 33 (that is, the point of common connection of the resistances 32, 48 and 49) is grounded through a capacitance 50. The resistance 49 and capacitance 50 comprise a decoupling and filter network for the D.C. supply voltage and are not, then, per se part of the amplifier circuit.

The collector of the transistor 43 is directly coupled by a conductor 51 to the base of the transistor 44—the collector of which is connected by a conductor 52 to the supply voltage. The emitter of the transistor 44 is connected to ground through a resistance 53, and the output of the amplifier appears at the terminal V which is connected to the emitter of the transistor 44 through a capacitance 54.

The emitter of the transistor 44 and base of the transistor 43 are coupled by a resistance 55 which defines a feedback loop applying a portion of the output signal from the emitter of the transistor 44 to the amplifier input or base of the transistor 43. The resistance 55, in addition to stabilizing the amplifier circuit to prevent changes in amplification otherwise caused by drift in the characteristics of the transistors, also reduces the impedance and voltage swing of the collectors of the transistors 17 and 17' in the two modulator circuits. As a result of such reduction, the load resistance 32 can be made sufficiently large to reduce the collector voltage on transistors 17 and 17' to about one or two volts; and under such voltage conditions, heating and drift of these two transistors are reduced to very low values.

The amplifier circuit in its operation accepts the two outputs provided by the separate tunnel diode modulator circuits which are fed to the input of the amplifier through the capacitance 34. Consequently, the outputs of the modulators are aggregated across the capacitance 34 and the point or terminal T, which may be taken to be both the output of the modulators and input of the amplifier, is a point of addition. The aggregated output of the modulators is then amplified to raise the output level of the resultant to a value suitable for driving subsequent circuits.

For purposes of presenting a specific example of component values in a typical illustrative circuit, the following may be considered:

| | |
|---|---|
| Tunnel diode **16** | 3712. |
| Transistor **17** | 2N2189. |
| Resistance **19** | 56 ohms. |
| Capacitance **20** | 200 picofarads. |
| Resistance **21** | 10K ohms. |
| Resistance **22** | 10K ohms. |
| Resistance **25** | 470 ohms. |
| Resistance **26** | 270 ohms. |
| Resistance **27** | 10K to 1.0 megohm. |
| Resistance **28** | 1.0K to 5.0 megohms. |
| Capacitance **30** | 1.0 microfarad to 100 microfarads. |
| Resistance **32** | 10K ohms. |
| Capacitance **34** | .10 microfarad. |
| Diode **34*a*** | Forward-biased germanium diode IN198. |
| Resistance **34*b*** | 33K ohms. |
| Transistor **43** | 2N2189. |
| Transistor **44** | 2N2189. |
| Resistance **45** | 3.9K ohms. |
| Resistance **46** | 1.0K ohms. |
| Capacitance **47** | 10 microfarads to 100 microfarads. |
| Resistance **48** | 10K ohms. |
| Resistance **49** | 1.0K ohms. |
| Capacitance **50** | 6.8 microfarads. |
| Resistance **53** | 4.7K ohms. |
| Capacitance **54** | 1.0 microfarad. |
| Resistance **55** | 100K ohms. |
| Supply voltage | —30 volts D.C. |

Input and output signals are applied between the terminals indicated and ground.

It should be appreciated that the specific circuit values set forth imply no criticality and can be varied greatly depending upon internal and external parameters, the choice of transistors, and the precise function intended for the circuit in any environmental setting, etc.; and where ranges are indicated in the foregoing catalog, the exact values selected will be largely established by external parameters.

It will be apparent from the prior description that the invention comprehends a method of suppressed-carrier modulation in which a carrier signal voltage waveform and a variable control signal therefor are algebraically added and the sum thereof applied across a current-conducting circuit element characterized by having positive and negative resistance operational regions and being capable of transition therebetween in accordance with changes in the voltage applied thereacross; and in which the output current waveform, which is the modulated resultant of the carrier signal, is determined and is in phase with the carrier signal when the zero level thereof causes operation of the circuit element in the positive resistance region thereof, is of reversed phase when the zero level of the carrier signal causes operation of the circuit element in the negative resistance region thereof, and is substantially zero when the zero level of the carrier signal causes operation of the circuit element at the point of transition between such positive and negative regions.

While in the foregoing specification an embodiment of the invention has been set forth in considerable detail for purposes of making an adequate disclosure thereof, it will be appreciated by those skilled in the art that numerous changes may be made in such details without departing from the spirit and principles of the invention.

I claim:

1. In combination with a voltage source and a printed circuit board equipped with conductors, a modulator circuit connected across said voltage source and comprising: a tunnel diode and a transistor connected in series therewith, said transistor having an emitter, base and collector the first of which is connected to said tunnel diode and the last of which comprises an output for said modulator circuit, first and second input means respectively adapted to have applied thereto an A.C. signal to be modulated and a D.C. control signal therefor, a coupling network connecting each of said input means to the base of said transistor, a low frequency oscillation-suppression network in shunt with said diode, and a minimal-inductance high frequency oscillation-suppression capacitance also in shunt with said diode, whereby operation of said diode in the negative resistance region of the characteristic curve thereof is attained and stability of operation in such region enforced, said tunnel diode having an anode connected to one side of said voltage source and a cathode connected to said transistor and a conductive shell connected with said cathode, and said capacitance including a conductive casing disposed about said shell and being in engagement therewith to define an electrical connection therebetween with the result that said casing is electrically connected to said cathode, said anode being connected to a conductor on one side of said board and said casing being secured to said board on the opposite side thereof in facing relation with a portion of said conductor to which said anode is connected, said casing in association with the conductor-equipped board and tunnel diode being operative to provide the aforesaid minimal-inductance capacitance.

2. In combination with a voltage source and a printed circuit board equipped with conductors, a modulator circuit connected across said voltage source and comprising: a tunnel diode characterized by having both positive resistance and negative resistance regions of operation, first and second input means respectively adapted to have applied thereto an A.C. signal to be modulated and a D.C. control signal therefor, an output network connected to said diode and providing a direct current resistance in series therewith of a lower value than the maximum value of the negative resistance exhibited by the diode, a pair of coupling networks respectively connecting said input means across said diode, and a minimal-inductance high frequency oscillation-suppression capacitance in shunt with said diode, whereby operation of said diode in the negative resistance region of the characteristic curve thereof is attained and stability of operation in such region enforced said tunnel diode having an anode connected to one side of said voltage source and a cathode connected to said output network and a conductive shell connected with said cathode, and said capacitance including a conductive casing disposed about said shell and being in engagement therewith to define an electrical connection therebetween with the result that said casing is electrically connected to said cathode, said anode being connected to a conductor on one side of said board and said casing being secured to said board on the opposite side thereof in facing relation with a portion of said conductor to which said anode is connected, said casing in association with the conductor-equipped board and tunnel diode being operative to provide the aforesaid minimal-inductance capacitance.

3. In combination with a printed circuit board having a pair of conductors therealong, a tunnel diode having an anode connected to one of said conductors and a cathode connected to the other of said conductors and having also a conductive shell connected with said cathode, and a conductive casing having an opening therein conforming substantially to the external configuration of said diode and snugly receiving the same therein and being in engagement with said shell to define an electrical connection therebetween, said casing being mechanically secured to said printed circuit panel on the side thereof opposite the aforesaid one conductor and in facing relation with a portion thereof and being electrically connected to said cathode through the agency of said shell, the capacitance effectively developed across said diode as a consequence of said casing in association with the conductor-equipped circuit board and tunnel diode being operative to suppress high frequency oscillations of the diode without introducing significant inductance in series therewith.

4. A circuit network of the character described comprising: a pair of modulator circuits each including a tunnel diode and a transistor connected in series therewith, said transistor having a base, an emitter connected to said tunnel diode and a collector which comprises an output for the associated circuit, first and second input means respectively adapted to have applied thereto an A.C. signal to be modulated and a D.C. control signal therefor, and further including a pair of coupling networks respectively connecting each of said input means to the base of said transistor; and an amplifier circuit including a transistor having a collector which defines in part an output for said amplifier and having also a base, which defines an input therefor connected to the outputs of each of said modulator circuits whereby the input signal to said amplifier constitutes the aggregate of the outputs of said modulator circuits, and a negative feedback resistance connecting the output and input of said amplifier circuit and being effective to stabilize the same against changes in amplification otherwise caused by drift in the characteristics of said amplifier transistor and also being effective to reduce voltage swings of the collectors of the transistors respectively comprised by said modulator circuits.

5. The circuit network of claim 4 in which a coupling capacitance is connected between the input of said amplifier circuit and the outputs of each of said modulator circuits and is operative to provide low frequency cut-off preventing communication of the D.C. control signals to the input of said amplifier circuit.

6. A circuit network of the character described comprising: a pair of modulator circuits and including a tunnel diode having cathode and anode elements, a transistor connected in series with said tunnel diode and having an emitter, base and collector the first of which is connected to one of the elements of said tunnel diode and the last of which comprises an output for the associated circuit, a load resistance in series with said collector for connecting the same to one side of a voltage source with the other element of said diode being connected to the other side of such source, first and second input means respectively adapted to have applied thereto an A.C. signal to be modulated and a D.C. control signal therefor, a coupling network connecting said first input means with said base, a second coupling network connecting said second input means with said base, a biasing network for connecting said base to the aforesaid other side of such voltage source and including a reference diode and resistance in series therewith, and further including a minimal-inductance high frequency oscillation-suppression capacitance in shunt with said tunnel diode; and an amplifier circuit including a transistor having a collector which defines in part an output for said amplifier and having also a base which defines an input therefor connected to the outputs of each of said modulator circuits whereby the input signal to said amplifier constitutes the aggregate of the outputs of said modulator circuits, and a negative feedback resistance connecting the output and input of said amplifier circuit and being effective to stablize the same against changes in amplification otherwise caused by drift in the characteristics of said amplifier transistor and also being effective to reduce voltage swings of the collectors of the transistors respectively comprised by said modulator circuits.

7. The circuit network of claim 6 in which each of said high frequency oscillation-suppression capacitances comprises a conductive casing substantially enclosing the associated tunnel diode therein and being electrically connected to the cathode thereof.

8. The circuit network of claim 6 in which a coupling capacitance is connected between the input of said amplifier circuit and the outputs of each of said modulator circuits and is operative to provide low frequency cut-off preventing communication of the D.C. control signals to the input of said amplifier circuit.

9. The circuit network of claim 8, and further including in each of said modulator circuits a low frequency oscillation-suppression network connected in shunt with the associated tunnel diode.

10. The circuit network of claim 9 in which the same load resistance is common to the collector of each of the transistors respectively comprised by said modulator circuits.

11. The circuit network of claim 10 in which each of the aforesaid coupling networks is an attenuation network, and in which each of said second coupling networks is a filter network.

12. The circuit network of claim 11 in which the aforesaid amplifier circuit further includes a second transistor having an emitter and base, the base of said second transistor being connected to the collector of the other amplifier transistor, said negative feedback resistance being connected between the emitter of said second transistor and the base of the other amplifier transistor, and the emitter of said second transistor providing the output signal of said amplifier circuit.

References Cited by the Examiner

UNITED STATES PATENTS

| | | | |
|---|---|---|---|
| 3,090,563 | 5/1963 | Engel | 307—88.5 |
| 3,108,233 | 10/1963 | Wasson et al. | 332—52 |
| 3,127,567 | 3/1964 | Chang | 307—88.5 |
| 3,127,574 | 3/1964 | Sommers | 307—88.5 |
| 3,166,713 | 1/1965 | Chang et al. | 332—52 |
| 3,191,065 | 6/1965 | Vargiu | 307—88.5 |

DAVID G. REDINBAUGH, *Primary Examiner.*

J. W. CALDWELL, *Assistant Examiner.*